United States Patent
Robin

(10) Patent No.: US 9,515,220 B2
(45) Date of Patent: Dec. 6, 2016

(54) LIGHT EMITTING DIODE WITH DOPED QUANTUM WELLS AND ASSOCIATED MANUFACTURING METHOD

(71) Applicant: Commissariat a L'Energie Atomique et aux Energies Alternatives, Paris (FR)

(72) Inventor: Ivan-Christophe Robin, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/938,058

(22) Filed: Nov. 11, 2015

(65) Prior Publication Data

US 2016/0141449 A1    May 19, 2016

(30) Foreign Application Priority Data

Nov. 19, 2014  (FR) ..................... 14 61201

(51) Int. Cl.
| H01L 33/04 | (2010.01) |
|---|---|
| H01L 33/00 | (2010.01) |
| H01L 33/32 | (2010.01) |
| H01L 33/06 | (2010.01) |
| H01L 33/18 | (2010.01) |

(52) U.S. Cl.
CPC ........... *H01L 33/04* (2013.01); *H01L 33/0075* (2013.01); *H01L 33/06* (2013.01); *H01L 33/32* (2013.01); *H01L 33/18* (2013.01)

(58) Field of Classification Search
CPC ....... H01L 33/04; H01L 33/0075; H01L 33/32
USPC .......................................................... 257/13
See application file for complete search history.

(56) References Cited

U.S. PATENT DOCUMENTS

| 8,232,560 | B2 | 7/2012 | Robin et al. | |
|---|---|---|---|---|
| 9,130,099 | B2 | 9/2015 | Robin | |
| 2002/0053676 | A1 | 5/2002 | Kozaki | |
| 2005/0098789 | A1* | 5/2005 | Kozaki | B82Y 20/00 257/97 |
| 2007/0278474 | A1 | 12/2007 | Tsutsumi et al. | |
| 2010/0148150 | A1* | 6/2010 | Miki | H01L 33/06 257/13 |
| 2010/0283064 | A1* | 11/2010 | Samuelson | B82Y 20/00 257/88 |
| 2011/0042643 | A1* | 2/2011 | Stauss | B82Y 20/00 257/13 |
| 2013/0001637 | A1* | 1/2013 | Fudeta | H01L 33/06 257/103 |

(Continued)

FOREIGN PATENT DOCUMENTS

| WO | WO 2006/035852 A2 | 4/2006 |
|---|---|---|
| WO | WO 2014/154690 A1 | 10/2014 |

OTHER PUBLICATIONS

U.S. Appl. No. 14/748,707, filed Jun. 24, 2015, Hubert Bono et al.

(Continued)

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

A light emitting diode based on GaN including an active zone located between an n-doped layer and a p-doped layer that together form a p-n junction, wherein the active zone includes at least one n-doped emissive layer.

14 Claims, 4 Drawing Sheets

(56) References Cited

U.S. PATENT DOCUMENTS

2014/0166980 A1* 6/2014 Goda .................. H01L 33/06
 257/13
2015/0060904 A1 3/2015 Robin et al.

OTHER PUBLICATIONS

U.S. Appl. No. 14/750,156, filed Jun. 25, 2015, Ivan-Christophe Robin et al.
U.S. Appl. No. 14/779,516, filed Sep. 23, 2015, Ivan-Christophe Robin et al.
French Preliminary Search Report issued Apr. 15, 2015 in French Application 14 61201, filed on Nov. 19, 2014 (with English Translation of Categories of Cited Documents).

* cited by examiner

LIGHT EMITTING DIODE WITH DOPED QUANTUM WELLS AND ASSOCIATED MANUFACTURING METHOD

TECHNICAL DOMAIN

The domain of this invention is light emitting diodes (LEDs) and light emitting devices based on LEDs (screens, projectors, picture walls, etc.).

STATE OF PRIOR ART

The technique currently used to manufacture LEDS based on semiconductors consists of making a p-n junction, in other words making electrical contact between a p-doped semiconductor and an n-doped semiconductor, with an intrinsic region, in other words unintentionally doped between these p and n doped semiconductors. A depletion zone is then obtained at the p-n junction. By passing an electric current in this structure, radiation charge recombinations (electrons or holes) are then obtained at the depletion zone, causing emission of light.

The materials based on GaN (GaN, InGaN, AlGaN) are materials currently used commercially to manufacture LEDs in the UV, blue, green or even red for LEDs in the form of nanowires. The band gap energy of GaN, equal to 3.42 eV at ambient temperature can obtain UV emission. By adding indium to GaN to form the InGaN alloy, the energy of the band gap is reduced so that emission wavelengths can be shifted into the visible.

Quantum Wells (QW) are frequently formed in the intrinsic region in order to increase the radiation emission efficiency of a LED. This confines charges in the quantum wells and prevents these charges from being lost on non-radiation defects. In the most frequently used techniques, emission is obtained from quantum wells made from the InGaN alloy with 5 to 30% of indium emitting in the blue and as far as in the red.

However, the difference in mobility between electrons and holes tends to impose a recombination very closer to the p-doped semiconducting region, or even in this p-doped region, leading to a limited radiative emission efficiency.

One method of getting around this difficulty is to confine electrons in the intrinsic region by means of an electron blocking layer (EBL) interposed between the intrinsic region and the p-doped semiconducting region. This prevents recombinations from taking place outside the intrinsic region and thus increases the radiative recombination rate. This electron blocking layer is usually made from AlGaN with 8 to 20% of aluminium.

However, this electron blocking layer increases the manufacturing complexity of the diode. This manufacturing requires optimisation and calibration of the aluminium flux in addition to optimisation and calibration of gallium and indium fluxes. Furthermore, the growth temperature of this EBL layer is not the same as the growth temperature of the other layers in the diode. Furthermore, when the diode is in the form of a nanowire, it is not easy to find growth conditions that enable this EBL layer to homogenously cover the flanks of the nanowire. Finally, this EBL layer must be p-doped, which requires optimised doping of AlGaN.

Another solution aims at increasing the uniformity of the distribution of holes in the quantum wells so that their injection is not restricted to quantum wells closest to the p-doped region alone. It is proposed that this can be done by p type doping of barrier layers located in the intrinsic region, typically using magnesium, so that each well is located between two barrier layers. This solution seems difficult to implement because it is essential to avoid diffusion of the p-type dopant in the quantum wells. The risk is that the radiative recombination efficiency would be cancelled out in the quantum wells, and therefore the luminescence would be strongly reduced.

PRESENTATION OF THE INVENTION

The invention aims at offering a light emitting diode with an enhanced radiative recombination rate and with a better emission efficiency, while preventing the above-mentioned problems.

To achieve this, it discloses a light emitting diode based on GaN, comprising an active zone located between an n-doped layer and a p-doped layer that together form a p-n junction, characterised in that the active zone comprises at least one n-doped emissive layer.

Some preferred but non-limitative aspects of this light emitting diode are as follows:
  the active zone comprises a plurality of emissive layers, each sandwiched between two barrier layers, and at least the emissive layer closest to the p-doped layer is an n-doped emissive layer;
  the at least one n-doped emissive layer is sandwiched between two barrier layers, of which at least the barrier layer located on the side of the p-doped layer is p-doped;
  the at least one n-doped emissive layer is sandwiched between two unintentionally doped barrier layers;
  the n-doping level of the at least one emissive layer is equal to at least twice and not more than 100 times the unintentionally doping level of the barrier layers;
  the n-doped layer and the p-doped layer are GaN layers, the at least one emissive layer is an InGaN layer and the barrier layers are GaN layers.

The invention also includes a method of making such a light emitting diode including n doping of at least one emissive layer in the active zone.

BRIEF DESCRIPTION OF THE DRAWINGS

Other aspects, purposes, advantages and characteristics of the invention will become clear after reading the following detail description of preferred embodiments of the invention given as non-limitative examples with reference to the appended drawings on which.

DETAILED PRESENTATION OF PARTICULAR EMBODIMENTS

Figure 1:
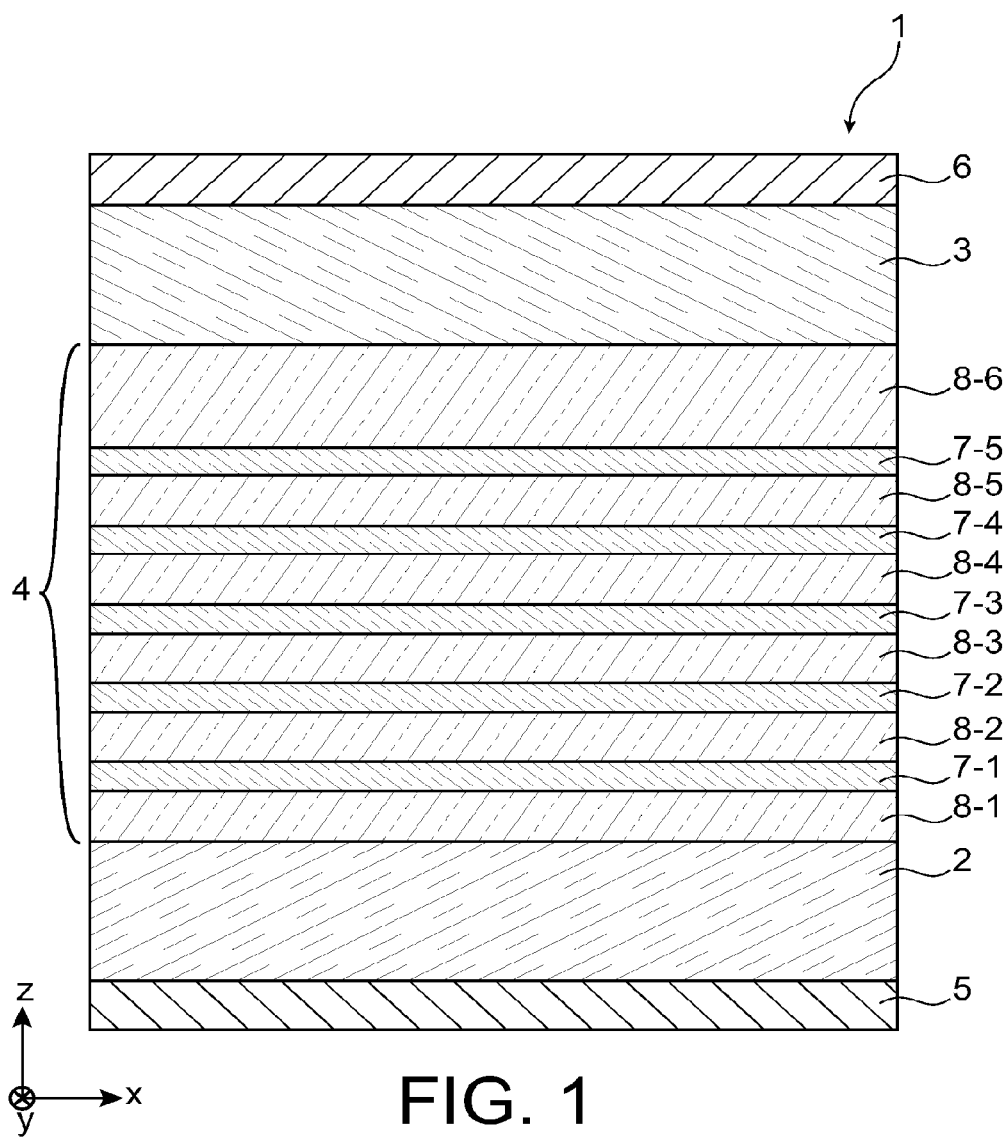
FIG. 1 is a diagram showing an example embodiment of a LED according to the invention.

Refer firstly to FIG. 1 that diagrammatically shows a particular embodiment of a light emitting diode 1 or LED 100.

The LED 1 comprises a p-n junction formed by a layer 2 that is n-doped, for example by the addition of silicon or germanium, and a layer 3 that is p-doped, for example by the addition of magnesium or carbon. A first metal electrode 5 is placed in contact with the n-doped layer 2 of the p-n junction and forms a cathode of the LED 1, and a second metal electrode 6 is placed in contact with the p-doped layer 3 of the p-n junction and forms an anode of the LED 1.

In general, the n-doped layer 2 of the p-n junction may have a donor concentration between about $10^{17}$ and $10^{20}$ donors/$cm^3$, and the p-doped layer 3 of the p-n junction may have an acceptor concentration between about $10^{15}$ and $10^{20}$ acceptors/$cm^3$.

The thickness (along the Z axis in FIG. 1) of the n-doped layer 2 of the p-n junction may for example be between 50 nm and 2 µm, and the thickness of the p-doped layer 3 of the p-n junction may for example be between 5 nm and 2 µm.

The n-doped layer 2 is for example an $In_{Xn}Ga_{(1-Xn)}N$ layer and the p-doped layer 3 is for example an $In_{Xp}Ga_{(1-Xp)}N$ layer, where Xn and Xp are indium compositions typically between 0 and 0.25. In the following description, the example Xn=Xp=0 will be considered, the doped layers 2 and 3 being made from GaN-n and GaN-p respectively.

The LED 1 comprises an active zone 4 between the doped layers 2 and 3, in which radiative recombinations occur leading to a light emission from the LED 1. The active zone 4 comprises particularly at least one emissive layer forming a quantum well sandwiched between two barrier layers.

Thus, the active zone 4 comprises m emissive layers 7-1, 7-2, 7-3, 7-4, 7-5, where m is an integer number greater than or equal to 1 and typically less than 50, and m+1 barrier layers 8-1, 8-2, 8-3, 8-4, 8-5, 8-6 such that each emissive layer is arranged between two barrier layers, and therefore the active zone 4 is composed of an alternating stack of emissive layers and barrier layers in particular with a barrier layer 8-1 on the side of the n-doped layer 2 and a barrier layer 8-6 on the side of the p-doped layer 3.

In the example in FIG. 1, the active zone 4 of the LED 1 comprises five emissive layers 7-1, 7-2, 7-3, 7-4, 7-5 each forming a quantum well. The thickness of each emissive layer is between 0.5 and 10 nm, and is 3 nm in the example studied. Each emissive layer may for example be an InGaN layer, with an indium composition that can be between 5 and 30%.

And the active zone 4 for the LED 1 comprises 6 barrier layers 8-1, 8-2, 8-3, 8-4, 8-5, 8-6 alternating with the emissive layers. The thickness of each barrier layer is between 1 nm and 30 nm. The barrier layer 8-6 on the side of the p-doped layer may be thicker than the other barrier layers 8-1, 8-2, 8-3, 8-4, 8-5 in order to prevent the dopants, generally magnesium, contained in the p-doped layer 3 from diffusing into the quantum wells. It is 30 nm thick in the example studied, while the other barrier layers are 10 nm thick. Each barrier layer may for example be a GaN layer.

In one preferred embodiment, the LED 1 does not have an electron blocking layer between the active zone 4 and the p-doped layer 3 of the p-n junction. The p-doped layer 3 of the p-n junction is then in direct contact with the active zone 4.

But in one possible embodiment, the LED 1 may comprise an electron blocking layer (not shown) located between the active zone 4 and the p-doped layer 3 of the p-n junction, for example an AlGaN layer.

In the framework of the invention, at least one of the emissive layers 7-1, 7-2, 7-3, 7-4, 7-5 is n-doped, and the other emissive layers are unintentionally doped. This at least one n-doped emissive layer is preferably the emissive layer 7-5 closest to the p-doped layer 3. As a variant, several successive emissive layers on the same side as the p-doped layer 3 are be n-doped, for example the three emissive layers 7-3, 7-4 and 7-5. Or all the emissive layers 7-1, ..., 7-5 can be n-doped, as is the case in the example studied.

Barriers grow at higher temperatures than the emissive layers which has the effect of making the dopants of emissive layers diffuse towards the barrier layers which degrades the performance of the LED, this diffusion having a greater impact on the emissive layers that go through more thermal cycles (i.e. those located on the side of the n-doped layer 2). Therefore the performance of the LED is not degraded if a reduced number of n-doped emissive layers on the same side as the p-doped layer 3 is chosen and, particularly if only the emissive layer closest to the p-doped layer 3 is chosen. The manufacturing of the LED is also facilitated because there is no need to evacuate dopants from the chamber before a barrier layer is grown, for non-intentionally doped emissive layers.

Unlike the solution that consists of doping p wells for which a high injection efficiency of holes into quantum wells close to the n-doped layer 2 is required, the invention accepts this low hole injection efficiency in quantum wells furthest from the p-doped layer 3, and instead proposes to increase the density of electrons in quantum wells in which the holes are actually present, in other words in the emissive layer(s) closest to the p-doped layer 3. Since holes are essentially restricted to these emissive layers, and the electron density in these layers is increased due to n doping of the at least one emissive layer, the number of radiative recombinations increases.

In a first variant embodiment, the at least one n-doped emissive layer is sandwiched between two barrier layers of which at least the first barrier layer located on the side of the p-doped layer 3 of the p-n junction is p-doped. Considering the example of n doping of the emissive layer 7-5 closest to the p-doped layer 3, the barrier layer 8-6 on the same side as the p-doped layer 3 is then p doped. Obviously, it would also be possible for all or some of the barrier layers to be p doped by the addition of magnesium or carbon. Thus in this variant embodiment, it is also intended to improve the injection efficiency of holes in the various quantum wells, particularly so that they do not remain blocked in the quantum well(s) closest to the p-doped layer 3 of the p-n junction.

In one embodiment, the at least p-doped barrier layer is only partially p-doped to prevent diffusion of the dopant in the adjacent emissive layer(s). Partially doped means that only a selected region of the barrier layer is p-doped, typically a central region that is not in contact with an emissive layer. A partially p-doped barrier layer can thus be decomposed along the Z axis into a lower non-intentionally doped sublayer, a central p-doped sublayer, and an upper non-intentionally doped sublayer.

In a second variant embodiment, the at least one n-doped emissive layer is sandwiched between two non-intentionally doped barrier layers.

The level of n doping of at least one emissive layer is then at least twice and not more than 100 times the unintentional doping level of the barrier layers. Preferably, the n doping level of the at least one emissive layer is equal to at least ten times and not more than fifty times the unintentional doping level of the barrier layers. This doping level is preferably more than $10^{18}$ donors/$cm^3$.

The unintentional doping level of the barrier layers is such that the concentration of residual donors is typically between $10^{16}$ donors/$cm^3$ and $10^{18}$ donors/$cm^3$, preferably less than $5 \times 10^{17}$ donors/cm$^3$, for example $10^{17}$ donors/cm$^3$, and the n doping level of the at least one emissive layer is thus equal to not more than $10^{20}$ donors/cm$^3$.

Figure 2:
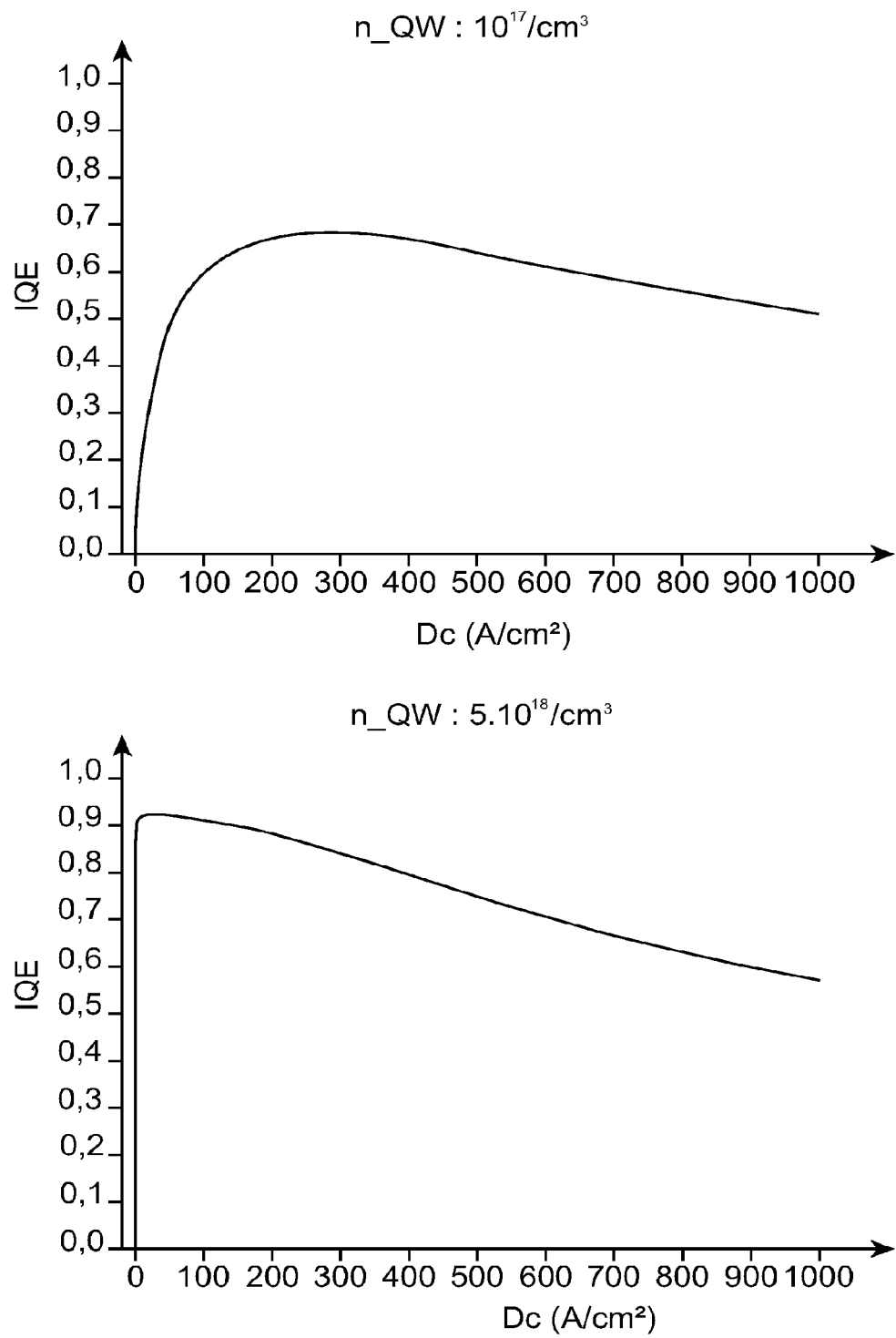
FIG. 2 shows internal quantum efficiencies for electrical injection for different doping layers of the n-doped emissive layer.

FIG. 2 shows internal quantum efficiencies for the emission of photons for different doping levels of the n-doped emissive layer of the studied LED, for which it is important to remember that it comprises five 3 nm thick InGaN emissive layers sandwiched between 10 nm thick GaN barrier layers, except for the layer 8-6 closest to the p-doped layer 3 of the p-n junction that is 30 nm thick. The n-doped layer 2 of the p-n junction is doped by $10^{19}$ donors/cm$^3$ and the p-doped layer 3 of the p-n junction is doped by $10^{19}$ acceptors/cm$^3$.

Unintentional doping of the barrier layers is $10^{17}$ donors/cm$^3$ and n doping (<<n_QW>>) of the emissive layers is either $10^{17}$ donors/cm$^3$ (top in FIG. 2), or $5 \times 10^{18}$ donors/cm$^3$ (bottom in FIG. 2). It can be seen that the internal quantum efficiency IQE, expressed as a function of the current density Dc (in A/cm$^2$), increases when the concentration of n dopants in the wells increases, starting from low current densities. The maximum efficiency thus increases from about 70% to more than 90%.

Figure 3:
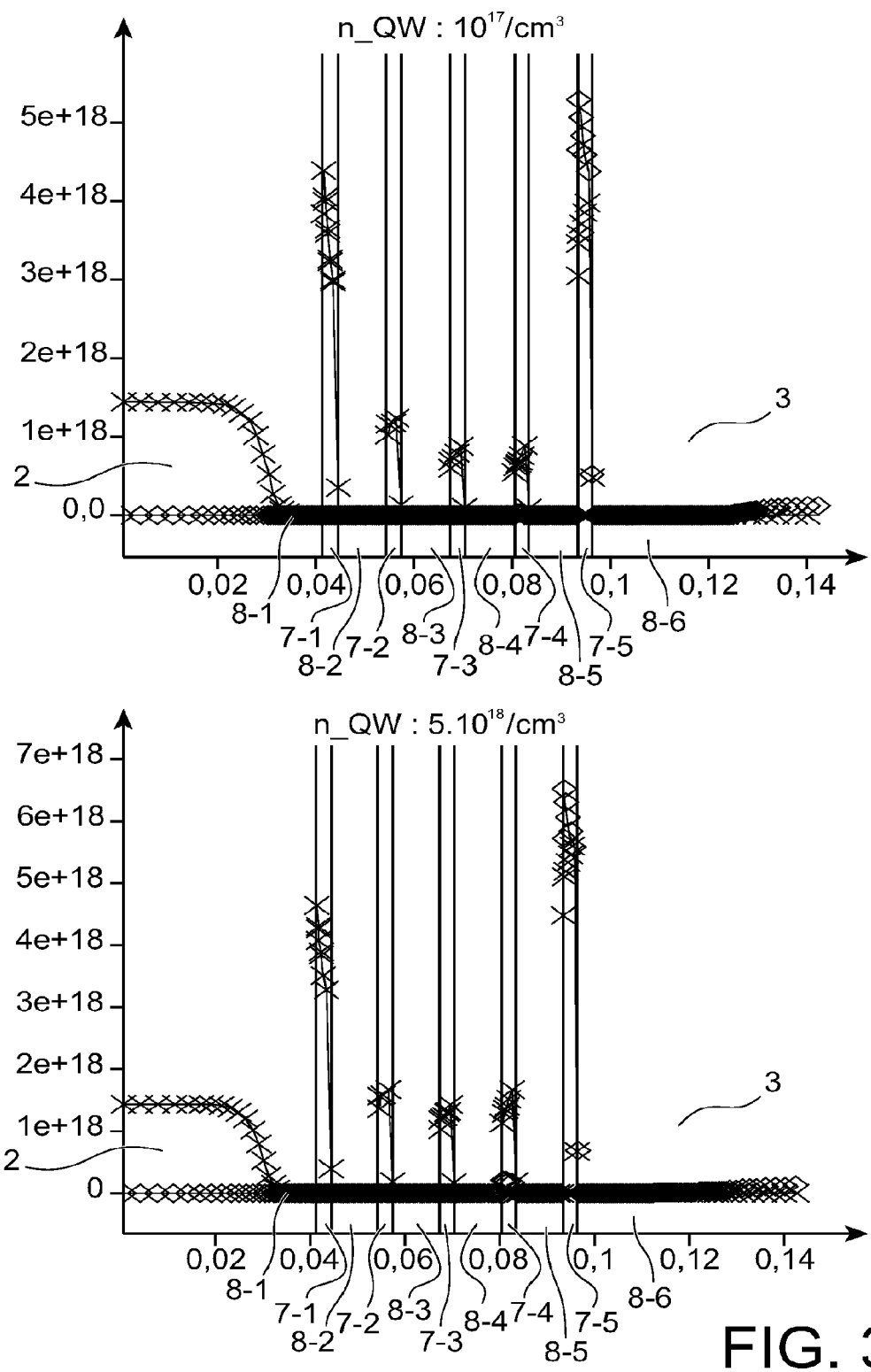
FIG. 3 shows the distribution of electrons and holes in a diode without intentional doping of the emissive layers and in a diode with n doping of the emissive layers according to the invention.

FIG. 3 shows the distribution of electrons (shown by crosses) and holes (shown by diamonds) in a diode according to the invention with n doping (<<n_QW>>) of emissive layers that is equal to either $10^{17}$ donors/cm$^{-3}$ (top in FIG. 3), or $5 \times 10^{18}$ donors/cm$^3$ (bottom in FIG. 3). It can be seen that the electron density is higher in the well 7-5 closest to the p-doped layer 3 of the p-n junction when this well is n-doped. The charges are then better balanced in this well 7-5 and the number of radiative recombinations is thus increased.

Such a LED 1 functions regardless of the orientation of the structure, regardless of whether it is in the c plane (in the presence of a high internal electric field), the M plane, in semi-polar, etc.

The LED 1 may be made in the form of a planar diode as shown in FIG. 1, in other words in the form of a stack of layers formed on a substrate (the substrate not being shown in FIG. 1), the main faces of the different layers being arranged parallel to the plane of the substrate (parallel to the (X,Y) plane). An example embodiment of the LED 1 in the form of such a planar diode is as follows.

The first step is to grow a first GaN layer with a thickness of between 1 and 4 μm on a sapphire substrate, for example by Metal Organic Chemical Vapour Deposition (MOCVD) at a temperature of between 950 and 1100° C. This growth is achieved by forming the GaN layer 2 n-doped by silicon, with a thickness of between 50 nm and 2 μm.

The active zone 4 is then made by doping the quantum wells (emissive layers), and not doping the barriers.

The temperature is firstly reduced to between 790 and 860° C. to grow a 10 nm thick unintentionally doped barrier layer at a growth rate of about 250 nm/h forming the layer 8-1. The temperature is then reduced to between 700 and 800° C. to grow a first doped emissive layer 7-1 at a growth rate of between 30 and 100 nm/h. Silicon doping is performed during growth of the emissive layer using a silane flux.

These barrier layer and emissive layer growth steps are repeated until the active zone is finalised. About 100 s is necessary to grow an emissive layer, which leaves enough time to selectively dope the emissive layers and not the barriers.

The temperature is then increased to between 980° C. and 1100° C. to grow the GaN layer 3 p-doped by magnesium with a thickness of between 5 nm and 1 μm.

The second metal electrode 6 is then made in the form of an Ni/Au layer on the p-doped layer 3, and the first metal electrode 5 is finally made in the form of a Ti/Au layer on the n-doped layer 2 (after separation of the n-doped layer 2 from the first GaN layer with a thickness of between 1 and 4 μm).

Figure 4A:
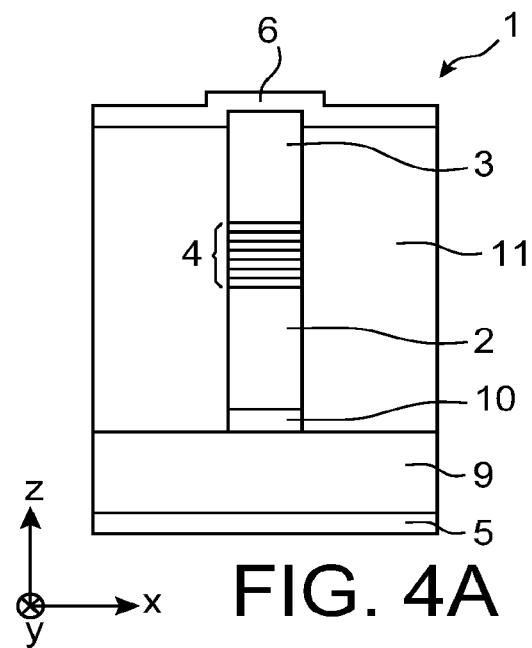
FIGS. 4A and 4B diagrammatically show example embodiments of a LED in the form of a nanowire.

As a variant, the LED 1 may be made in the form of nanowires. FIG. 4A shows such a LED 1 made in the form of axial nanowires, these nanowires comprising a stack composed from the first electrode 5, a semiconducting substrate 9 (for example gallium) of the n type, a nucleation layer 10 for growth of nanowires, the n-doped layer 2, the active zone 4, the p-doped layer 3 and the second electrode 6. An insulating material 11 may surround at least part of these nanowires that extend parallel to the Z axis.

Figure 4B:
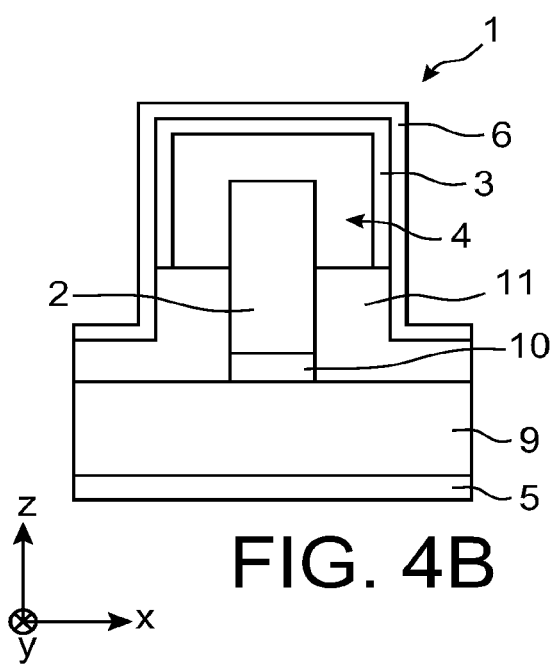

FIG. 4B shows a LED 1 made in the form of nanowires, these nanowires comprising a stack formed from the first electrode 5, the semiconducting substrate 9, the nucleation layer 10 and the n-doped layer 2. Insulating portions 11 partly surround the n-doped layer 2 and the nucleation layer 10. The active zone 4 is made such that it surrounds at least part of the n-doped layer 2. The p-doped layer 3 is made such that it surrounds the active zone 4. Finally, the second electrode 6 is made by covering the p-doped layer 3.

As a variant of the two example embodiments described in FIGS. 4A and 4B, the structure of these nanowires may be inverted, in this case with a semiconducting substrate 9 for example made from gallium nitride, of the p type, on which the p-doped layer 3 is formed, followed by the other elements of the LED 1 in the reverse order to that described in FIGS. 4A and 4B.

The invention is not limited to the LED as described above but it also relates to a method of making such a LED in which the formation of the active zone comprises manufacturing of at least one n-doped emissive layer. According to this method, the at least one emissive layer may be grown at a growth rate of between 30 and 100 nm/h. Furthermore, the layers of the light emitting diode may be planar layers made by growth of layers above each other, or layers made by growth in the form of radial or axial nanowires.

The invention claimed is:

1. A light emitting diode based on GaN, comprising an active zone located between an n-doped layer and a p-doped layer that together form a p-n junction, wherein the active zone comprises a plurality of emissive layers each sandwiched between two barrier layers, and wherein at least the emissive layer closest to the p-doped layer is an n-doped emissive layer sandwiched between two non-intentionally doped barrier layers, wherein the n doping level of the at least one n-doped emissive layer is greater than $10^{18}$ donors/cm$^3$.

2. The light emitting diode according to claim 1, in which the n doping level of the at least one n-doped emissive layer is equal to at least twice and not more than 100 times the non-intentionally doping level of the non-intentionally doped barrier layers.

3. The light emitting diode according to claim 2, in which the n doping level of the at least one n-doped emissive layer is equal to at least ten times and not more than fifty times the non-intentional doping level of the non-intentionally doped barrier layers.

4. The light emitting diode according to claim 1, in which the non-intentional doping level of the non-intentionally doped barrier layers is between $10^{16}$ donors/cm$^3$ and $10^{20}$ donors/cm$^3$.

5. The light emitting diode according to claim 1, in which the n doping level of the at least one n-doped emissive layer is not more than $10^{20}$ donors/cm$^3$.

6. The light emitting diode according to claim 1, in which the n-doped layer and the p-doped layer are GaN layers, the at least one n-doped emissive layer is an InGaN layer and the barrier layers are GaN layers.

7. The light emitting diode according to claim 1, not having an electron blocking layer between the active zone and the p-doped layer.

8. The light emitting diode according to claim 1, in which the barrier layer closest to the p-doped layer is thicker than the other barrier layers.

9. A method of making a light emitting diode comprising an active zone located between an n-doped layer and a p-doped layer that together form a p-n junction, wherein a step of forming the active zone includes forming at least one n-doped emissive layer sandwiched between two barrier layers, wherein at least the emissive layer closest to the p-doped layer is an n-doped emissive layer sandwiched between two non-intentionally doped barrier layers,
wherein the n doping level of the at least one n-doped emissive layer is greater than $10^{18}$ donors/cm$^3$.

10. The method according to claim 9, in which the at least one n-doped emissive layer is formed by growth at a growth rate between 30 and 100 nm/h.

11. The method according to claim 9, in which the layers of the light emitting diode are planar layers formed by growth above each other.

12. The method according to claim 9, in which the layers of the light emitting diode are formed by growth in the form of radial or axial nanowires.

13. The light emitting diode according to claim 1, wherein the n doping level of the at least one n-doped emissive layer is equal to or greater than $5\times10^{18}$ donors/cm$^3$.

14. The method according to claim 9, wherein the n doping level of the at least one n-doped emissive layer is equal to or greater than $5\times10^{18}$ donors/cm$^3$.

* * * * *